(12) United States Patent
Harada

(10) Patent No.: US 6,570,934 B1
(45) Date of Patent: May 27, 2003

(54) SINGLE-END-ZERO RECEIVER CIRCUIT

(75) Inventor: Kanji Harada, deceased, late of Yamanashi (JP); Kakuro Harada, legal representative

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/454,913

(22) Filed: Dec. 6, 1999

(30) Foreign Application Priority Data

Dec. 7, 1998 (JP) .......................................... 10-346437

(51) Int. Cl.⁷ .......................... H03K 9/00; H04L 27/06; H04L 27/14; H04L 27/22
(52) U.S. Cl. ...................... 375/316; 375/371; 375/317; 375/257; 327/70
(58) Field of Search ................................ 375/355, 354, 375/360, 371, 372, 373, 219, 316, 317, 318; 327/70, 99, 62, 79, 65, 78, 82, 63, 96, 94, 563, 108

(56) References Cited

U.S. PATENT DOCUMENTS 5,889,419 A * 3/1999 Fischer et al. ................ 327/70
5,940,448 A * 8/1999 Kuo ............................ 375/316
6,433,627 B1 * 8/2002 Ruesch ........................ 327/563
6,462,589 B2 * 10/2002 Taylor ........................ 327/108

* cited by examiner

Primary Examiner—Phuong Phu
(74) Attorney, Agent, or Firm—Whitham, Curtis & Christofferson, P.C.

(57) ABSTRACT

An object of the invention is to prevent an erroneous operation of the internal circuits due to glitches and to dispense with a circuit as a countermeasure against glitches. There are provided a low-value threshold detector, a high-value threshold detector, and a set/reset latch circuit. The low-value threshold detector receives two differential data input DATA+ and DATA− signals and detects whether both input signals are lower than a first threshold voltage. The high-value threshold detector receives the input DATA+ and DATA− signals and detects whether one of the input signals is higher than a second threshold voltage. And the set/reset latch circuit is used for outputting an SE0 signal. the set/reset latch circuit is set when the levels of both input DATA+ and DATA− signals are lower than or equal to the first threshold voltage, and is reset when one of the levels of the input DATA+ and DATA− signals is higher than or equal to the second threshold voltage.

7 Claims, 5 Drawing Sheets

SINGLE-END-ZERO RECEIVER CIRCUIT

BACKGROUND OF THE INVENTION

The present invention relates to a single-end-zero receiver circuit for differential data.

A conventional single-end-zero receiver circuit for differential data will be described with reference to FIGS. 1 and 2.

FIG. 1 shows an example of conventional single-end-zero receiver circuits. FIG. 1 shows a DATA+ input terminal 101, a DATA− input terminal 102, Schmitt buffers 103 and 104, a NOR gate circuit 105, and an SE0 output terminal 106. The DATA+ input terminal 101 inputs a differential data input signal DATA+. And the DATA− input terminal 102 input a differential data input signal DATA−. The two input terminals connect to the NOR gate circuit 105 through each of the Schmitt buffers 103 and 104 respectively. The outputs of the NOR gate circuit 105 is connects to the SE0 output terminal 106.

FIG. 2 is a timing chart on the single-end-zero receiver circuit of FIG. 1. FIG. 2 shows a differential data input signal DATA+ of the DATA+ input terminal 101, a differential data input signal DATA− of the DATA− input terminal 102, respective outputs of the Schmitt buffers 103 and 104, and a single-end-zero signal SE0 to be output from the SE0 output terminal 106.

Each of the Schmitt buffers 103 and 104 shown in FIG. 1 has input threshold hysteresis. Therefore, as shown in FIG. 2, the output of the Schmitt buffer 103 varies in order at timing points a1, a4, a5, and a6 with timing deviations that are based on input threshold values. Similarly, the output of the Schmitt buffer 104 varies in order at timing points a2 and a3. The single-end-zero signal SE0 is obtained by decoding the outputs of the Schmitt buffers 103 and 104 with the NOR gate circuit 105. Therefore, glitches g1 and g2 occur on the SE0 output terminal in the period between the timing points a1 and a2 and the period between the timing points a3 and a4, respectively.

However, the active period of the single-end-zero signal SE0 that is actually necessary is the period between the timing points a5 and a6. And the glitches g1 and g2 occur on the SE0 output terminal 106 when the differential data input signals DATA+ and DATA− cross each other, as described above.

Accordingly, a certain measure against glitches needs to be taken on the input side of the single-end-zero signal SE0, which means a limitation on circuit designing.

SUMMARY OF THE INVENTION

An object of the present invention is to provide a single-end-zero receiver of differential data which prevents an erroneous operation of the internal circuits due to glitches and dispenses with any circuit as a countermeasure against glitches.

The invention provides a single-end-zero receiver circuit comprising a low-value threshold detector, a high-value threshold detector, and a set/reset latch circuit.

The low-value threshold detector receives both of first and second differential data input signals and for detecting whether both of the first and second differential data input signals are lower than a first threshold voltage. The high-value threshold detector receives both of the first and second differential data input signals and for detecting whether one of the first and second differential data input signals is higher than a second threshold voltage that is higher than the first threshold voltage.

And the set/reset latch circuit outputs an SE0 signal.

The set/reset latch circuit is set when levels of both of the first and second differential data input signals are lower than or equal to the first threshold voltage. And the set/reset latch circuit is reset when one of the levels of the first and second differential data input signals is higher than or equal to the second threshold voltage.

Each of the above components can easily be structured as a logic circuit. Since glitches are prevented from occurring on the SE0 output terminal or in a single-end-zero signal when two differential data input signals cross each other, no glitch-induced erroneous operation occurs in the internal circuits. Further, no external circuit as a countermeasure against glitches is necessary.

DESCRIPTION OF THE PREFERRED EMBODIMENTS

Figure 1:
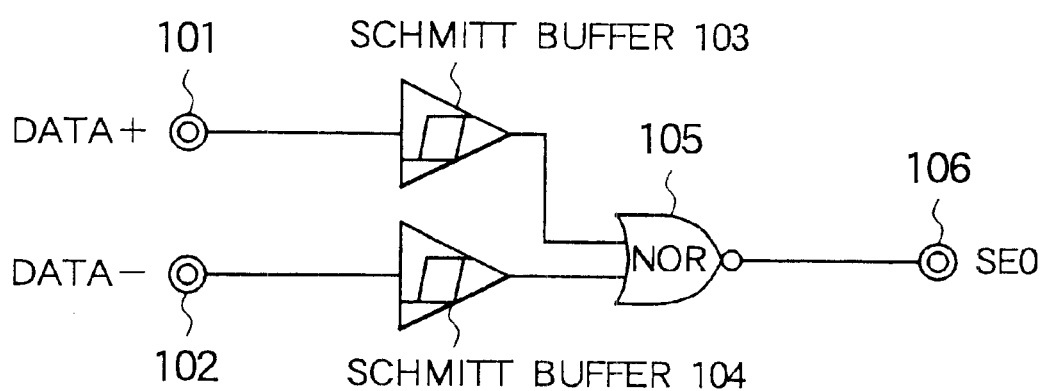
FIG. 1 shows the configuration of a conventional single-end-zero receiver circuit.
Figure 2:
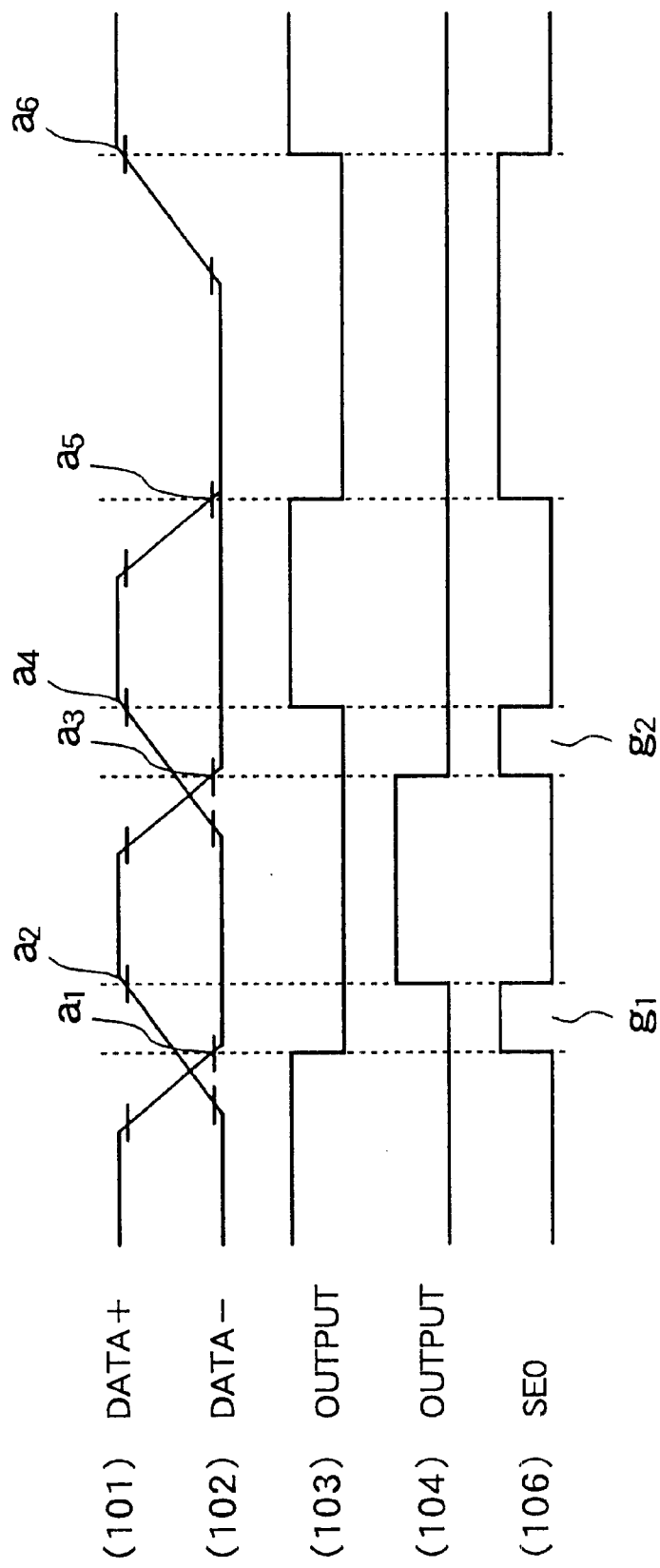
FIG. 2 is a timing chart showing the operation of the conventional single-end-zero receiver circuit of FIG. 1.
Figure 3:
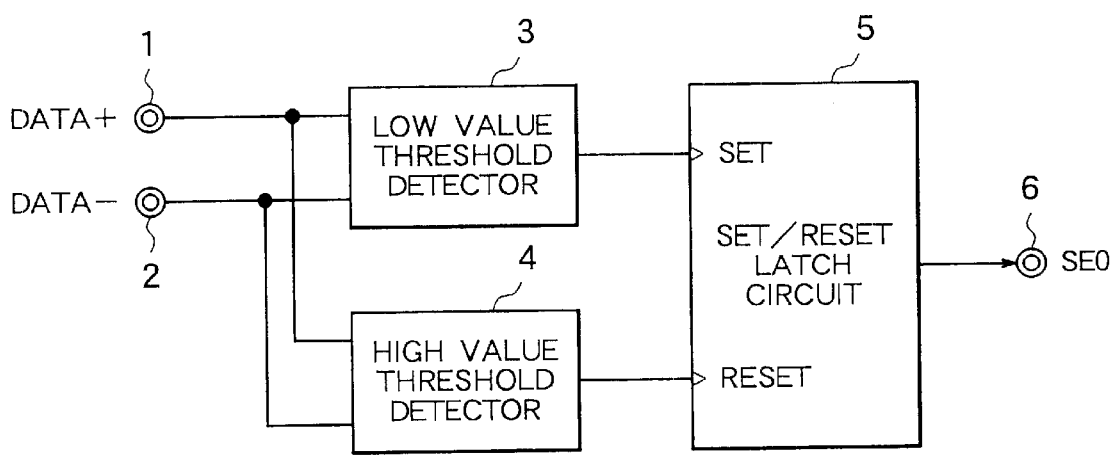
FIG. 3 shows the basic configuration of a single-end-zero receiver circuit according to the present invention.

A single-end-zero receiver circuit for differential data according to an embodiment of the present invention will be hereinafter described with reference to FIG. 3. As shown in FIG. 3, the single-end-zero receiver circuit according to this embodiment has a low-value threshold detector 3 and a high-value threshold detector 4, and a set/reset latch circuit 5.

Each of the low-value threshold detector 3 and a high-value threshold detector 4 is connected to both a DATA+ terminal 1 and a DATA− terminal 2 for input signals, and the set/reset latch circuit 5 that is connected to an SE0 terminal 6 for an output signal.

The low-value threshold detector 3 receives two differential data input signals (or DATA+ and DATA− signals). When detecting that both input DATA+ and DATA− signals are lower than a prescribed low-value threshold voltage, the low-value threshold detector 3 outputs a detection result to the set/reset latch circuit 5. The high-value threshold detector 4 also receives the two input DATA+ and DATA− signals. When detecting that one of the two input DATA+ and DATA− signals is higher than a prescribed high-value threshold voltage, the high-value threshold detector 4 outputs a detection result to the set/reset latch circuit 5. Receiving respective outputs of the low-value threshold detector 3 and the high-value threshold detector 4, the set/reset latch circuit 5 outputs a single-end-zero (or SE0) signal to the SE0 terminal 6.

Next, the operation of the single-end-zero receiver circuit having the above configuration will be described. Referring to FIG. 3, when both input DATA+ and DATA− signals are lower than the prescribed low-value threshold voltage, the output of the low-value threshold detector 3 is at a high level "1" and a set signal for the set/reset latch circuit 5 is rendered active. At this time point, since both input DATA+ and DATA− signals are lower than the prescribed high-value threshold voltage, the output of the high-value threshold detector 4 is at a low level "0" and a reset signal for the set/reset latch circuit 5 is inactive. Therefore, the output SE0 signal is at a high level "1."

There is a case that a transition occurs from the state that both input DATA+ and DATA− signals are lower than the prescribed low-value threshold voltage to a state that one of the two input DATA+ and DATA− signals is higher than the prescribed high-value threshold voltage. In this case, the output level of the high-value threshold detector 4 becomes a high level "1" and the reset signal for the set-reset latch circuit 5 is rendered active. At this time point, since one of the input DATA+ and DATA− signals is higher than the low-value threshold voltage, the output level of the low-value threshold detector 3 becomes a low level "0" and hence the set signal for the set/reset latch circuit 5 is rendered inactive. The level of the SE0 signal becomes a low level "0."

Next, referring to FIGS. 4 and 5, the above single-end-zero receiver circuit will be described in more detail.

Figure 4:
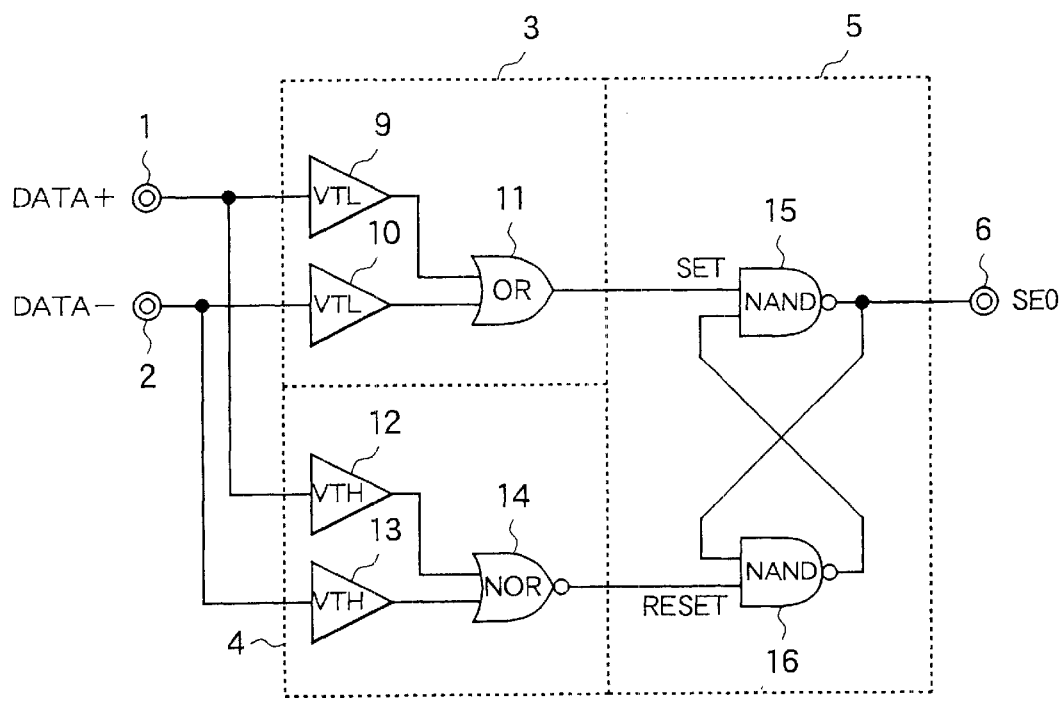
FIG. 4 shows a logic circuit corresponding to the basic configuration of the single-end-zero receiver circuit of FIG. 3.

FIG. 4 shows a logic circuit as a specific example corresponding to the basic configuration of the single-end-zero receiver circuit of FIG. 3. As shown in FIG. 4, the low-value threshold detector 3 shown in FIG. 3 is composed of low-value threshold buffers 9 and 10 and an OR circuit 11. On the other hand, the high-value threshold detector 4 shown in FIG. 3 is composed of high-value threshold buffers 12 and 13 and a NOR circuit 14.

One input DATA+ signal is input to the low-value threshold buffer 9 and the high-value threshold buffer 12, and the other input DATA− signal is input to the low-value threshold buffer 10 and the high-value threshold buffer 13.

To facilitate the understanding of the description, it is assumed that the outputs of the low-value threshold buffer 9 and the high-value threshold buffer 12 are inverted at a time point when the input DATA+ signal reaches 0.8 V. And the outputs of the low-value threshold buffer 10 and the high-value threshold buffer 13 are inverted at a time point when the input DATA− signal reaches 1.3 V.

The OR gate circuit 11 receives the outputs of the low-value threshold buffers 9 and 10, and the NOR gate circuit 14 receives the outputs of the high-value threshold buffers 12 and 13.

The set/reset latch circuit 5 is composed of NAND gate circuits 15 and 16 that are cross-connected to each other. The output of the OR gate circuit 11 is used as a set input and the output of the NOR gate circuit 14 is used as a reset input.

Next, referring to FIG. 5 together with FIG. 4, a description will be made of how the single-end-zero receiver circuit operates when it receives two differential data input (DATA+ and DATA−) signals.

Figure 5:
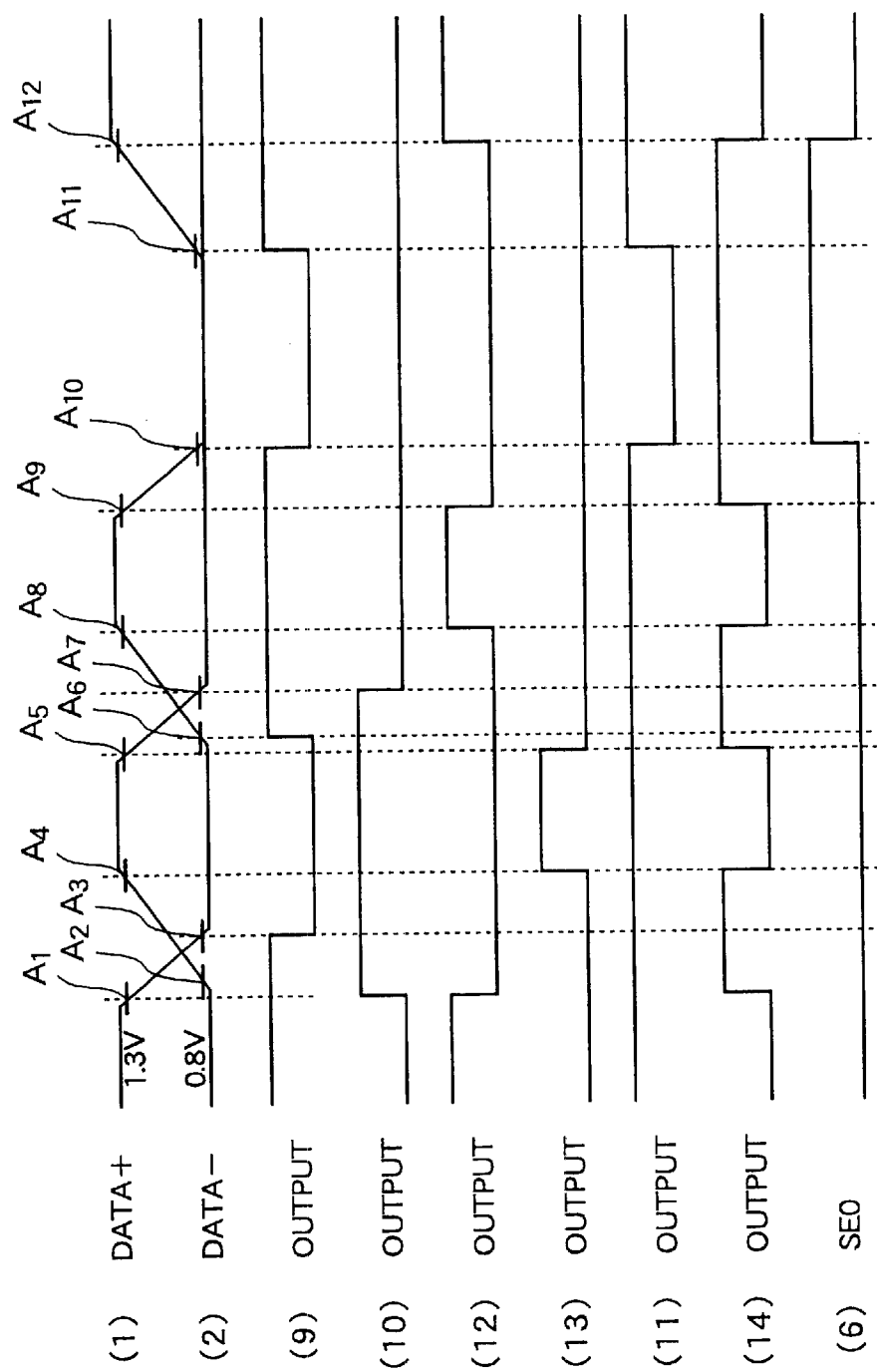
FIG. 5 is a timing chart showing the operation of the single-end-zero receiver circuit of FIG. 3.

FIG. 5 is a timing chart on the single-end-zero receiver circuit of FIG. 4. FIG. 5 shows respective input DATA+ and DATA− signals of the input terminals 1 and 2, respective outputs of the Schmitt buffers 9, 10, 12 and 13, respective outputs of the OR gate circuit 11 and the NOR gate circuit 14, and the SE0 signal to be output from the output SE0 terminal 6.

When data is transmitted as two differential data (or DATA+ and DATA−), usually the data is varied in the form of pairs of "0" and "1." If both input DATA+ and DATA− signals are "0" simultaneously, it means the end of a packet and the SE0 signal is "1" in this case. In an idling state in which no data is transmitted, data lines are pulled up and pulled down so that one of the input DATA+ and DATA− signals becomes "1" and the other becomes "0."

FIG. 5 shows a case where the rise-up time and the fall-down time of each of input DATA+ and DATA− signals are unbalanced, that is, the rise-up time is longer than the fall-down time. In conventional single-end-zero receiver circuits, glitches are prone to occur in an SE0 signal in the case where the rise-up time and the fall-down time are unbalanced. The invention is to prevent occurrence of glitches in an SE0 signal even in the case where the rise-up time and the fall-down time are unbalanced.

The output of the low-value threshold buffer 9 shown in FIG. 4 varies on the low threshold value side of the input DATA+ signal, that is, at timing points A3, A6, A10, and A11 in FIG. 5. Similarly, the output of the other low-value threshold buffer 10 varies on the low threshold value side of the input DATA− signal, that is, at timing points A2 and A7 in FIG. 5. The output of the high-value threshold buffer 12 varies on the high threshold value side of the input DATA+ signal, that is, at timing points A1, A8, A9, and A12 in FIG. 5. Similarly, the output of the other high-value threshold buffer 13 varies on the high threshold value side of the input DATA− signal, that is, at timing points A4 and A5 in FIG. 5.

The output of the OR gate circuit 11 shown in FIG. 4 becomes a set signal for the set/reset latch circuit 5 that is composed of the NAND gate circuits 15 and 16. At the timing point A10 in FIG. 5, the output of the OR gate circuit 11 becomes "0", that is, the set signal becomes active. At this time point, the output of the NOR gate circuit 14 as the reset signal is "1", that is, inactive. Therefore, at the timing point A10 in FIG. 5, the SE0 signal becomes "1", that is, active. At the timing point A11 in FIG. 5, since the input DATA+ signal varies from "0" to "1", the output of the low-value threshold buffer 9 varies and, at the same time, the output of the OR gate circuit 11 also varies from "0" to "1". At this time point, although the set signal for the SE0 signal becomes inactive, the output of the NOR gate circuit 14 as the reset signal is also "1", that is, inactive. Therefore, the SE0 signal keeps the preceding state "1" and remains active.

At the timing point A12 in FIG. 5, the input DATA+ signal becomes equal to the high threshold value, the output of the high-value threshold buffer 12 varies and, at the same time, the output of the NOR gate circuit 14 varies from "1" to "0". At this time point, the reset signal and the set signal for the set/reset latch circuit 5 become active and inactive, respectively, the SE0 signal becomes inactive. To satisfy the required active width of the SE0 signal, the set/reset latch circuit 5 that outputs the SE0 signal is so configured as to be set at the timing point A10 and reset at the timing point A12.

By obtaining a single-end-zero signal through decoding in the above manner, occurrence of glitches in the SE0 signal can be prevented even if the rise time and the fall time of each differential data input signal are unbalanced.

With the above configuration, since glitches are prevented from occurring in a single-end-zero signal when two differential data input signals cross each other, a glitch-induced erroneous operation does not occur in the internal circuits. Further, no external circuit as a countermeasure against glitches is necessary.

Further, the invention can prevent occurrence of glitches in a single-end-zero signal even if the rise-up time of one differential data input signal and the fall-down time of the other differential data input signal are unbalanced. This is by virtue of the configuration that the set/reset latch circuit is set and reset at different time points to satisfy the required active width of a single-end-zero signal.

What is claimed is:

1. A single-end-zero receiver circuit comprising:
   a low-value threshold detector for receiving both of first and second differential data input signals and for detecting whether both of the first and second differential data input signals are lower than a first threshold voltage;
   a high-value threshold detector for receiving both of the first and second differential data input signals and for detecting whether one of the first and second differential data input signals is higher than a second threshold voltage that is higher than the first threshold voltage; and
   a set/reset latch circuit for outputting a single-end-zero signal, the set/reset latch circuit being set when levels of both of the first and second differential data input signals are lower than or equal to the first threshold voltage, and being reset when one of the levels of the first and second differential data input signals is higher than or equal to the second threshold voltage.

2. The single-end-zero receiver circuit according to claim 1, wherein the low-value threshold detector comprises first and second low-value threshold buffers that receive the first and second differential data input signals, respectively, and an OR gate circuit that receives respective outputs of the first and second low-value threshold buffers.

3. The single-end-zero receiver circuit according to claim 1, wherein the high-value threshold detector comprises first and second high-value threshold buffers that receive the first and second differential data input signals, respectively, and a NOR gate circuit that receives respective outputs of the first and second high-value threshold buffers.

4. The single-end-zero receiver circuit according to claim 1, wherein the set/reset latch circuit comprises first and second NAND gate circuits that receive outputs of the low-value threshold detector and the high-value threshold detector, respectively, and are cross-connected to each other.

5. The single-end-zero receiver circuit according to claim 1, wherein the low-value threshold detector comprises first and second low-value threshold buffers that receive the first and second differential data input signals, respectively, and the high-value threshold detector comprises first and second high-value threshold buffers that receive the first and second differential data input signals, respectively, and wherein the set/reset latch circuit is set when both of the first and second low-value threshold buffers detect a logical value "0" and is reset when one of the first and second high-value threshold buffers detects a logical value "1".

6. The single-end-zero receiver circuit according to claim 1, wherein in an idling state in which no data signal is transmitted, data lines are pulled up and pulled down so that one of the first and second differential data input signals is kept at a high level and the other is kept at a low level.

7. The single-end-zero receiver circuit according to claim 1, wherein the set/reset latch circuit is set and reset at different time points to satisfy a required active width of the single-end-zero signal, whereby occurrence of glitches in the single-end-zero signal is prevented even if a rise-up time of one of the first and second differential data input signals and a fall-down time of the other are unbalanced.

* * * * *